US012690403B2

(12) United States Patent
Luo et al.

(10) Patent No.: US 12,690,403 B2
(45) Date of Patent: Jul. 21, 2026

(54) HALOGEN-FREE ETCHING OF SILICON NITRIDE

(71) Applicant: Applied Materials, Inc., Santa Clara, CA (US)

(72) Inventors: Zhiren Luo, San Jose, CA (US); Jeong Hwan Kim, San Jose, CA (US); Qian Fu, Pleasanton, CA (US); Abhijeet S. Bagal, Sunnyvale, CA (US)

(73) Assignee: Applied Materials, Inc., Santa Clara, CA (US)

( * ) Notice: Subject to any disclaimer, the term of this patent is extended or adjusted under 35 U.S.C. 154(b) by 291 days.

(21) Appl. No.: 18/203,404

(22) Filed: May 30, 2023

(65) Prior Publication Data

US 2024/0404837 A1      Dec. 5, 2024

(51) Int. Cl.
*H10P 50/28*        (2026.01)
*H01J 37/32*        (2006.01)

(52) U.S. Cl.
CPC ...... *H10P 50/283* (2026.01); *H01J 37/32449* (2013.01); *H01J 37/32816* (2013.01); *H01J 2237/182* (2013.01); *H01J 2237/334* (2013.01)

(58) Field of Classification Search
None
See application file for complete search history.

(56) References Cited

U.S. PATENT DOCUMENTS 9,779,956 B1 * 10/2017 Zhang ............... H01L 21/31116
10,079,154 B1 * 9/2018 Le .................... H01L 21/31116
11,087,989 B1 * 8/2021 Garcia De Gorordo ..................
                                                H01L 21/02263
2014/0080310 A1 3/2014 Chen et al.
2018/0226278 A1 8/2018 Arnepalli et al.
2022/0165580 A1 5/2022 Cui et al.

FOREIGN PATENT DOCUMENTS

KR    20190107158 A    9/2019
KR    20190142741 A    12/2019
KR    20220157476 A    11/2022
TW    201417173 A    5/2014
TW    201513215 A    4/2015
(Continued)

OTHER PUBLICATIONS

International Search Report and Written Opinion for PCT/US2024/029604 mailed Sep. 10, 2024, 9 pages.
(Continued)

*Primary Examiner* — Roberts P Culbert
(74) *Attorney, Agent, or Firm* — Kilpatrick Townsend & Stockton LLP

(57)        ABSTRACT

Methods of semiconductor processing may include providing a hydrogen-containing precursor to a processing region of a semiconductor processing chamber. A substrate may be disposed on a substrate support within the processing region. A layer of silicon-and-nitrogen-containing material may be disposed on the substrate. The methods may include forming plasma effluents of the hydrogen-containing precursor. The methods may include contacting the layer of silicon-and-nitrogen-containing material with plasma effluents of the hydrogen-containing precursor. The contacting may etch a portion of the layer of silicon-and-nitrogen-containing material.

20 Claims, 4 Drawing Sheets

300

(56)         References Cited

FOREIGN PATENT DOCUMENTS

| | | |
|---|---|---|
| TW | 201543567 A | 11/2015 |
| TW | 202029330 A | 8/2020 |
| TW | 202301464 A | 1/2023 |
| WO | 2022085424 A | 4/2022 |

OTHER PUBLICATIONS

TW113118834, "Office Action", Mar. 5, 2025, 11 pages.
Taiwanese Application No. 113118834, Office Action mailed on Sep. 4, 2025, 11 pages (1 page of English Translation and 10 pages of original documents).
International Application No. PCT/US2024/029604, International Preliminary Report on Patentability mailed on Dec. 11, 2025, 6 pages.
Korean Application No. 10-2025-7033984, Office Action mailed on May 13, 2026, 19 pages (10 pages of English Translation and 9 pages of original documents).

* cited by examiner

300

HALOGEN-FREE ETCHING OF SILICON NITRIDE

TECHNICAL FIELD

The present technology relates to semiconductor systems and processes. More specifically, the present technology relates to halogen-free etching of silicon nitride.

BACKGROUND

Integrated circuits are made possible by processes which produce intricately patterned material layers on substrate surfaces. Producing patterned material on a substrate requires controlled methods for removal of exposed material. Chemical etching is used for a variety of purposes including transferring a pattern in photoresist into underlying layers, thinning layers, or thinning lateral dimensions of features already present on the surface. Often it is desirable to have an etch process that etches one material faster than another facilitating, for example, a pattern transfer process. Such an etch process is said to be selective to the first material. As a result of the diversity of materials, circuits, and processes, etch processes have been developed with a selectivity towards a variety of materials.

Etch processes may be termed wet or dry based on the materials used in the process. For example, a wet etch may preferentially remove some oxide dielectrics over other dielectrics and materials. However, wet processes may have difficulty penetrating some constrained trenches and also may sometimes deform the remaining material. Dry etches produced in local plasmas formed within the substrate processing region can penetrate more constrained trenches and exhibit less deformation of delicate remaining structures. However, local plasmas may damage the substrate through the production of electric arcs as they discharge.

Thus, there is a need for improved systems and methods that can be used to produce high quality devices and structures. These and other needs are addressed by the present technology.

SUMMARY

Methods of semiconductor processing may include providing a hydrogen-containing precursor to a processing region of a semiconductor processing chamber. A substrate may be disposed on a substrate support within the processing region. A layer of silicon-and-nitrogen-containing material may be disposed on the substrate. The methods may include forming plasma effluents of the hydrogen-containing precursor. The methods may include contacting the layer of silicon-and-nitrogen-containing material with plasma effluents of the hydrogen-containing precursor. The contacting may etch a portion of the layer of silicon-and-nitrogen-containing material.

In some embodiments, the hydrogen-containing precursor may be or include diatomic hydrogen ($H_2$). The processing region may be maintained halogen-free. A layer of silicon-and-oxygen-containing material, a layer of silicon-containing material, or both may be disposed on the substrate. The methods may include providing an inert precursor with the hydrogen-containing precursor to the processing region. A flow rate of the inert precursor may be greater than a flow rate of the hydrogen-containing precursor. The plasma effluents may be formed at a plasma power of greater than or about 800 W. The plasma effluents may be formed at a plasma power of greater than or about 2,000 W. The contacting may form silane ($SiH_4$), ammonia ($NH_3$), or both. The substrate may be characterized by a temperature of less than or about 50° C. The substrate may be characterized by a temperature of less than or about −25° C. A pressure within the semiconductor processing chamber may be maintained at less than or about 100 mTorr. The contacting may etch the layer of silicon-and-nitrogen-containing material at an etch rate of greater than or about 1 Å/min.

Some embodiments of the present technology may encompass semiconductor processing methods. The methods may include providing a hydrogen-containing precursor to a processing region of a semiconductor processing chamber. A substrate may be disposed on a substrate support within the processing region. A layer of silicon-and-oxygen-containing material may be disposed on the substrate. A layer of silicon-and-nitrogen-containing material may be disposed on the layer of silicon-and-oxygen-containing material. The methods may include forming plasma effluents of the hydrogen-containing precursor. The plasma effluents may be formed at a plasma power of greater than or about 1,000 W. The methods may include contacting the layer of silicon-and-nitrogen-containing material with plasma effluents of the hydrogen-containing precursor. The contacting may selectively etch a portion of the layer of silicon-and-nitrogen-containing material relative to the layer of silicon-and-oxygen-containing material.

In some embodiments, the processing region may be maintained halogen-free. The substrate may be characterized by a temperature of less than or about 50° C.

Some embodiments of the present technology may encompass semiconductor processing methods. The methods may include providing a hydrogen-containing precursor to a processing region of a semiconductor processing chamber. A substrate may be disposed on a substrate support within the processing region. A layer of silicon-and-oxygen-containing material may be disposed on the substrate. A layer of silicon-and-nitrogen-containing material may be disposed on the layer of silicon-and-oxygen-containing material. The methods may include forming plasma effluents of the hydrogen-containing precursor. The methods may include contacting the layer of silicon-and-nitrogen-containing material with plasma effluents of the hydrogen-containing precursor. The contacting may selectively etch a portion of the layer of silicon-and-nitrogen-containing material relative to the layer of silicon-and-oxygen-containing material. The substrate may be characterized by a temperature of less than or about −50° C.

In some embodiments, the methods may include providing helium with the hydrogen-containing precursor to the processing region. The processing region may be maintained halogen-free. The plasma effluents may be formed at a plasma power of greater than or about 1,000 W.

Such technology may provide numerous benefits over conventional systems and techniques. For example, the processes may provide high selectivity for a silicon nitride etch relative to silicon and/or silicon oxide. Additionally, the processes may be performed without the use of a halogen material. These and other embodiments, along with many of their advantages and features, are described in more detail in conjunction with the below description and attached figures.

BRIEF DESCRIPTION OF THE DRAWINGS

A further understanding of the nature and advantages of the disclosed technology may be realized by reference to the remaining portions of the specification and the drawings.

Figure 1:
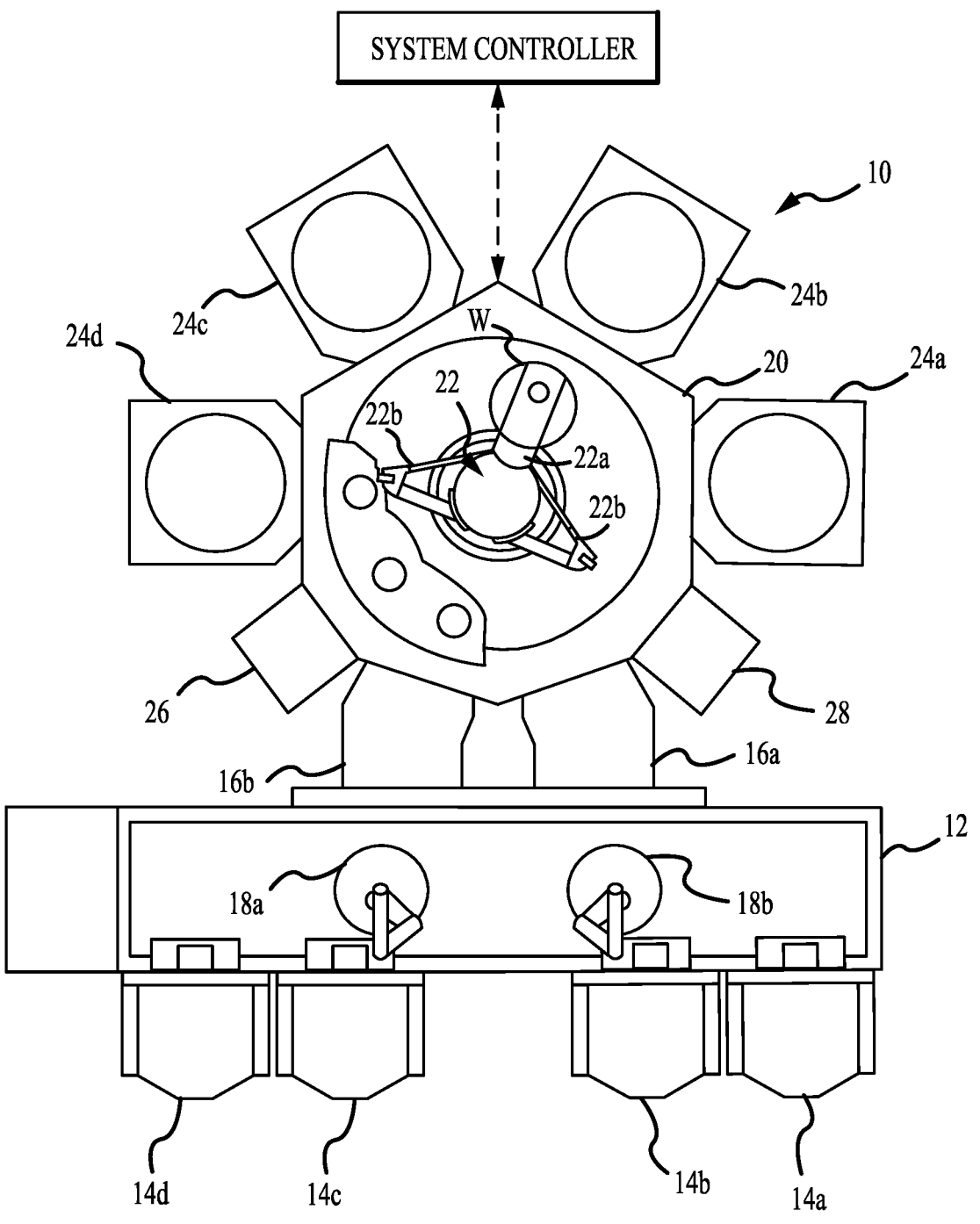
FIG. 1 shows a schematic top plan view of an exemplary processing system according to some embodiments of the present technology.

Several of the figures are included as schematics. It is to be understood that the figures are for illustrative purposes, and are not to be considered of scale unless specifically stated to be of scale. Additionally, as schematics, the figures are provided to aid comprehension and may not include all aspects or information compared to realistic representations, and may include exaggerated material for illustrative purposes.

In the appended figures, similar components and/or features may have the same reference label. Further, various components of the same type may be distinguished by following the reference label by a letter that distinguishes among the similar components. If only the first reference label is used in the specification, the description is applicable to any one of the similar components having the same first reference label irrespective of the letter.

DETAILED DESCRIPTION

Selectively etching silicon nitride material is beneficial in a variety of device process flows including in the formation of dynamic random access memory, FinFETs, and many other devices. The silicon nitride may be employed as a liner material or barrier material to serve as a barrier material, an etch stop material, or with dielectric materials to form insulating film stacks between device circuitry. To pattern or remove silicon nitride material, conventional processes may utilize halogen precursors or plasma products to etch silicon nitride. However, these conventional processes have been limited by low selectivity of silicon nitride material relative to other materials on substrates. Conventional processes have also suffered from downstream issues due to residue of the halogen precursors being present. The present technology overcomes these limitations by performing a halogen-free etch process that selectively removes silicon nitride material using one or more hydrogen precursors. The etch process may include providing hydrogen with one or more inert precursors to soften the material. Additionally, the present technology may utilize cryogenic temperatures to achieve ultra-high etch selectivity. Further, the present technology may provide a single-step process for removing silicon nitride material compared to conventional two-step processes, such as atomic layer etching (ALE), required for removing silicon nitride material.

Although the remaining disclosure will routinely identify specific etching processes utilizing the disclosed technology, it will be readily understood that the systems and methods are equally applicable to a variety of other processes as may occur in the described chambers. Accordingly, the technology should not be considered to be so limited as for use with the described etching processes alone. The disclosure will discuss one possible system and chamber that can be used with the present technology before describing systems and methods or operations of exemplary process sequences according to some embodiments of the present technology.

It is to be understood that the technology is not limited to the equipment described, and processes discussed may be performed in any number of processing chambers and systems.

FIG. 1 shows a top plan view of one embodiment of a processing system 10 of deposition, etching, baking, and/or curing chambers according to embodiments. The tool or processing system 10 depicted in FIG. 1 may contain a plurality of process chambers, 24a-d, a transfer chamber 20, a service chamber 26, an integrated metrology chamber 28, and a pair of load lock chambers 16a-b. The process chambers may include any number of structures or components, as well as any number or combination of processing chambers.

To transport substrates among the chambers, the transfer chamber 20 may contain a robotic transport mechanism 22. The transport mechanism 22 may have a pair of substrate transport blades 22a attached to the distal ends of extendible arms 22b, respectively. The blades 22a may be used for carrying individual substrates to and from the process chambers. In operation, one of the substrate transport blades such as blade 22a of the transport mechanism 22 may retrieve a substrate W from one of the load lock chambers such as chambers 16a-b and carry substrate W to a first stage of processing, for example, a treatment process as described below in chambers 24a-d. The chambers may be included to perform individual or combined operations of the described technology. For example, while one or more chambers may be configured to perform a deposition or etching operation, one or more other chambers may be configured to perform a pre-treatment operation and/or one or more post-treatment operations described. Any number of configurations are encompassed by the present technology, which may also perform any number of additional fabrication operations typically performed in semiconductor processing.

If the chamber is occupied, the robot may wait until the processing is complete and then remove the processed substrate from the chamber with one blade 22a and may insert a new substrate with a second blade. Once the substrate is processed, it may then be moved to a second stage of processing. For each move, the transport mechanism 22 generally may have one blade carrying a substrate and one blade empty to execute a substrate exchange. The transport mechanism 22 may wait at each chamber until an exchange can be accomplished.

Once processing is complete within the process chambers, the transport mechanism 22 may move the substrate W from the last process chamber and transport the substrate W to a cassette within the load lock chambers 16a-b. From the load lock chambers 16a-b, the substrate may move into a factory interface 12. The factory interface 12 generally may operate to transfer substrates between pod loaders 14a-d in an atmospheric pressure clean environment and the load lock chambers 16a-b. The clean environment in factory interface 12 may be generally provided through air filtration processes, such as HEPA filtration, for example. Factory interface 12 may also include a substrate orienter/aligner that may be used to properly align the substrates prior to processing. At least one substrate robot, such as robots 18a-b, may be positioned in factory interface 12 to transport substrates between various positions/locations within factory interface 12 and to other locations in communication therewith. Robots 18a-b may be configured to travel along a track system within factory interface 12 from a first end to a second end of the factory interface 12.

The processing system 10 may further include an integrated metrology chamber 28 to provide control signals, which may provide adaptive control over any of the processes being performed in the processing chambers. The integrated metrology chamber 28 may include any of a variety of metrological devices to measure various film properties, such as thickness, roughness, composition, and the metrology devices may further be capable of characterizing grating parameters such as critical dimensions, sidewall angle, and feature height under vacuum in an automated manner.

Each of processing chambers 24*a-d* may be configured to perform one or more process steps in the fabrication of a semiconductor structure, and any number of processing chambers and combinations of processing chambers may be used on multi-chamber processing system 10. For example, any of the processing chambers may be configured to perform a number of substrate processing operations including any number of deposition processes including cyclical layer deposition, atomic layer deposition, chemical vapor deposition, physical vapor deposition, as well as other operations including etch, pre-clean, pre-treatment, post-treatment, anneal, plasma processing, degas, orientation, and other substrate processes. Some specific processes that may be performed in any of the chambers or in any combination of chambers may be metal deposition, surface cleaning and preparation, thermal annealing such as rapid thermal processing, and plasma processing. Any other processes may similarly be performed in specific chambers incorporated into multi-chamber processing system 10, including any process described below, as would be readily appreciated by the skilled artisan.

Figure 2:
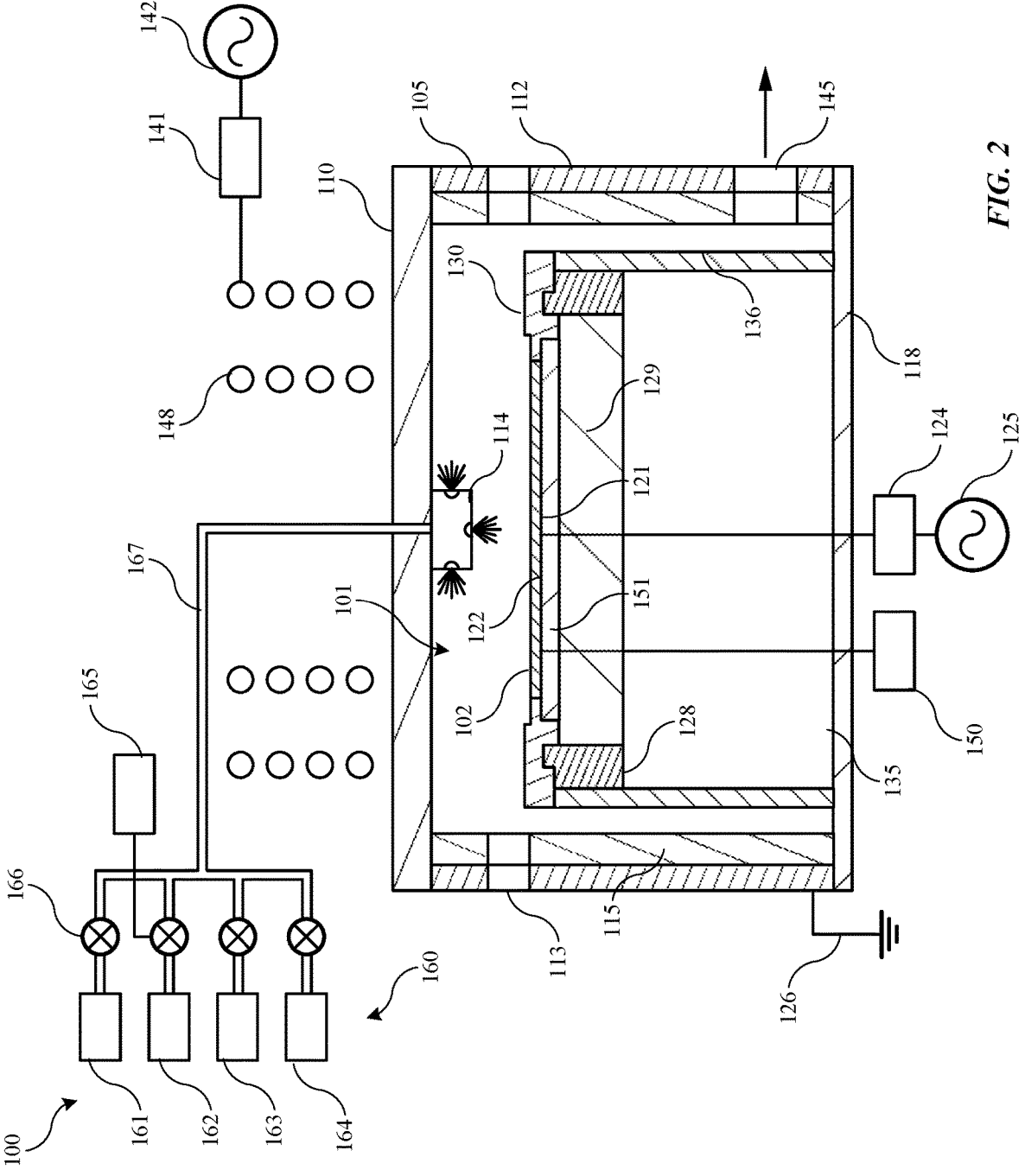
FIG. 2 shows a schematic cross-sectional view of an exemplary processing system according to some embodiments of the present technology.

FIG. 2 illustrates a schematic cross-sectional view of an exemplary processing chamber 100 suitable for patterning a material layer disposed on a substrate 302 in the processing chamber 100. The exemplary processing chamber 100 is suitable for performing a patterning process, although it is to be understood that aspects of the present technology may be performed in any number of chambers, and substrate supports according to the present technology may be included in etching chambers, deposition chambers, treatment chambers, or any other processing chamber. The plasma processing chamber 100 may include a chamber body 105 defining a chamber volume 101 in which a substrate may be processed. The chamber body 105 may have sidewalls 112 and a bottom 118 which are coupled with ground 126. The sidewalls 112 may have a liner 115 to protect the sidewalls 112 and extend the time between maintenance cycles of the plasma processing chamber 100. The dimensions of the chamber body 105 and related components of the plasma processing chamber 100 are not limited and generally may be proportionally larger than the size of the substrate 302 to be processed therein. Examples of substrate sizes include 200 mm diameter, 250 mm diameter, 300 mm diameter and 450 mm diameter, among others, such as display or solar cell substrates as well.

The chamber body 105 may support a chamber lid assembly 110 to enclose the chamber volume 101. The chamber body 105 may be fabricated from aluminum or other suitable materials. A substrate access port 113 may be formed through the sidewall 112 of the chamber body 105, facilitating the transfer of the substrate 302 into and out of the plasma processing chamber 100. The access port 113 may be coupled with a transfer chamber and/or other chambers of a substrate processing system as previously described. A pumping port 145 may be formed through the sidewall 112 of the chamber body 105 and connected to the chamber volume 101. A pumping device may be coupled through the pumping port 145 to the chamber volume 101 to evacuate and control the pressure within the processing volume. The pumping device may include one or more pumps and throttle valves.

A gas panel 160 may be coupled by a gas line 167 with the chamber body 105 to supply process gases into the chamber volume 101. The gas panel 160 may include one or more process gas sources 161, 162, 163, 164 and may additionally include inert gases, non-reactive gases, and reactive gases, as may be utilized for any number of processes. Examples of process gases that may be provided by the gas panel 160 include, but are not limited to, hydrocarbon containing gas including methane, sulfur hexafluoride, silicon chloride, carbon tetrafluoride, hydrogen bromide, hydrocarbon containing gas, argon gas, chlorine, nitrogen, helium, or oxygen gas, as well as any number of additional materials. Additionally, process gasses may include nitrogen, chlorine, fluorine, oxygen, and hydrogen containing gases such as $BCl_3$, $C_2F_4$, $C_4F_8$, $C_4F_6$, $CHF_3$, $CH_2F_2$, $CH_3F$, $NF_3$, $NH_3$, $CO_2$, $SO_2$, $CO$, $N_2$, $NO_2$, $N_2O$, and $H_2$, among any number of additional precursors.

Valves 166 may control the flow of the process gases from the sources 161, 162, 163, 164 from the gas panel 160 and may be managed by a controller 165. The flow of the gases supplied to the chamber body 105 from the gas panel 160 may include combinations of the gases form one or more sources. The lid assembly 110 may include a nozzle 114. The nozzle 114 may be one or more ports for introducing the process gases from the sources 161, 162, 164, 163 of the gas panel 160 into the chamber volume 101. After the process gases are introduced into the plasma processing chamber 100, the gases may be energized to form plasma. An antenna 148, such as one or more inductor coils, may be provided adjacent to the plasma processing chamber 100. An antenna power supply 142 may power the antenna 148 through a match circuit 141 to inductively couple energy, such as RF energy, to the process gas to maintain a plasma formed from the process gas in the chamber volume 101 of the plasma processing chamber 100. Alternatively, or in addition to the antenna power supply 142, process electrodes below the substrate 302 and/or above the substrate 302 may be used to capacitively couple RF power to the process gases to maintain the plasma within the chamber volume 101. The operation of the power supply 142 may be controlled by a controller, such as controller 165, that also controls the operation of other components in the plasma processing chamber 100.

A substrate support pedestal 135 may be disposed in the chamber volume 101 to support the substrate 302 during processing. The substrate support pedestal 135 may include an electrostatic chuck 122 for holding the substrate 302 during processing. The electrostatic chuck ("ESC") 122 may use the electrostatic attraction to hold the substrate 302 to the substrate support pedestal 135. The ESC 122 may be powered by an RF power supply 125 integrated with a match circuit 124. The ESC 122 may include an electrode 121 embedded within a dielectric body. The electrode 121 may be coupled with the RF power supply 125 and may provide a bias which attracts plasma ions, formed by the process gases in the chamber volume 101, to the ESC 122 and substrate 302 seated on the pedestal. The RF power supply 125 may cycle on and off, or pulse, during processing of the substrate 302. The ESC 122 may have an isolator 128 for the purpose of making the sidewall of the ESC 122 less attractive to the plasma to prolong the maintenance life cycle of the ESC 122. Additionally, the substrate support pedestal 135 may have a cathode liner 136 to protect the sidewalls of the substrate support pedestal 135 from the plasma gases and to extend the time between maintenance of the plasma processing chamber 100.

Electrode 121 may be coupled with a power source 150. The power source 150 may provide a chucking voltage of about 200 volts to about 2000 volts to the electrode 121. The power source 150 may also include a system controller for controlling the operation of the electrode 121 by directing a DC current to the electrode 121 for chucking and de-chucking the substrate 302. The ESC 122 may include heaters disposed within the pedestal and connected to a power source for heating the substrate, while a cooling base 129 supporting the ESC 122 may include conduits for circulating a heat transfer fluid to maintain a temperature of the ESC 122 and substrate 302 disposed thereon. The ESC 122 may be configured to perform in the temperature range required by the thermal budget of the device being fabri-cated on the substrate 302. For example, the ESC 122 may be configured to maintain the substrate 302 at a temperature of about −150° C. or lower to about 500° C. or higher depending on the process being performed.

The cooling base 129 may be provided to assist in controlling the temperature of the substrate 302. To mitigate process drift and time, the temperature of the substrate 302 may be maintained substantially constant by the cooling base 129 throughout the time the substrate 302 is in the cleaning chamber. In some embodiments, the temperature of the substrate 302 may be maintained throughout subsequent cleaning processes at temperatures between about −150° C. and about 500° C., although any temperatures may be utilized. A cover ring 130 may be disposed on the ESC 122 and along the periphery of the substrate support pedestal 135. The cover ring 130 may be configured to confine etching gases to a desired portion of the exposed top surface of the substrate 302, while shielding the top surface of the substrate support pedestal 135 from the plasma environment inside the plasma processing chamber 100. Lift pins may be selectively translated through the substrate support pedestal 135 to lift the substrate 302 above the substrate support pedestal 135 to facilitate access to the substrate 302 by a transfer robot or other suitable transfer mechanism as pre-viously described.

The controller 165 may be utilized to control the process sequence, regulating the gas flows from the gas panel 160 into the plasma processing chamber 100, and other process parameters. Software routines, when executed by the CPU, transform the CPU into a specific purpose computer such as a controller, which may control the plasma processing chamber 100 such that the processes are performed in accordance with the present disclosure. The software rou-tines may also be stored and/or executed by a second controller that may be associated with the plasma processing chamber 100.

Figure 3:
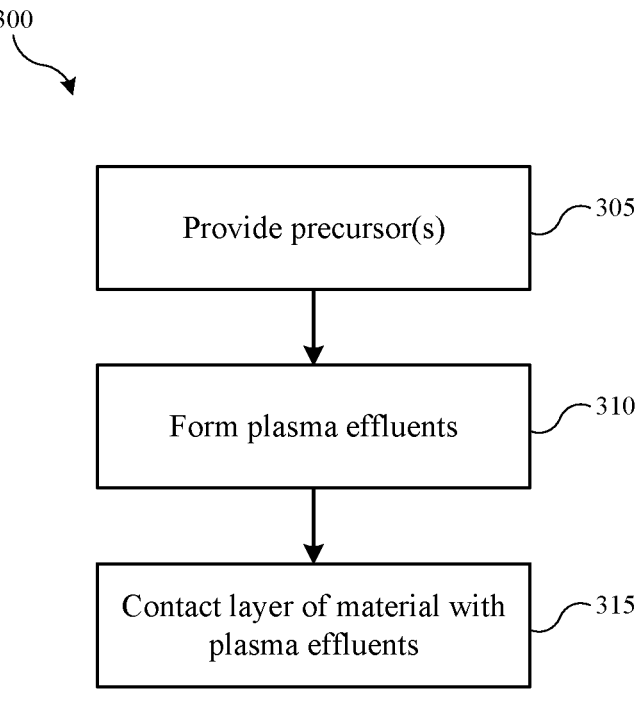
FIG. 3 shows selected operations in a method of semiconductor processing according to some embodiments of the present technology.

The chamber discussed previously may be used in per-forming exemplary methods, including etching methods. Turning to FIG. 3 is shown exemplary operations in a method 300 according to embodiments of the present tech-nology. Method 300 may include one or more operations prior to the initiation of the method, including front end processing, deposition, etching, polishing, cleaning, or any other operations that may be performed prior to the described operations. The method 300 may include a num-ber of optional operations, which may or may not be specifically associated with some embodiments of methods according to embodiments of the present technology. For example, many of the operations are described in order to provide a broader scope of the processes performed, but are not critical to the technology, or may be performed by alternative methodology as will be discussed further below. Method 300 may describe operations shown schematically in FIGS. 4A-4B, the illustrations of which will be described in conjunction with the operations of method 300. It is to be understood that the figures illustrate only partial schematic views, and a substrate may contain any number of additional materials and features having a variety of characteristics and aspects as illustrated in the figures.

Figure 4A:
FIGS. 4A-4B show schematic cross-sectional views of materials etched according to some embodiments of the present technology.
Figure 4A:
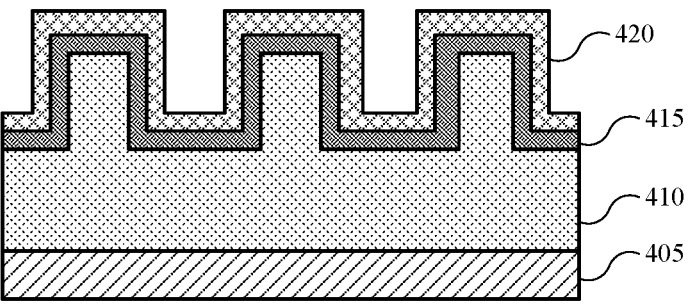

Method 300 may or may not involve optional operations to develop the semiconductor structure to a particular fab-rication operation. It is to be understood that method 300 may be performed on any number of semiconductor struc-tures 400 or substrates 405, as illustrated in FIG. 4A, including exemplary structures on which a silicon-and-nitrogen-containing material removal operation may be per-formed. Exemplary semiconductor structures may include a trench, via, or other recessed features that may include one or more exposed materials. For example, an exemplary substrate may contain silicon or some other semiconductor substrate material as well as interlayer dielectric materials through which a recess, trench, via, or isolation structure may be formed. Exposed materials at any time during the etch process may be or include one or more dielectric materials, a contact material, a transistor material, or any other material that may be used in semiconductor processes.

For example, as illustrated in FIG. 4A, a first layer of material 410 may overly the substrate 405. Substrate 405 may be any number of materials used in semiconductor processing. The substrate material may be or include silicon, germanium, dielectric materials including silicon oxide or silicon nitride, metal materials, or any number of combina-tions of these materials, which may be the substrate 405, or materials formed in structure 400. In the structure 400 shown in FIG. 4A, the first layer of material 410 may be a silicon-containing material, such as silicon. The first layer of material 410 may be patterned to form one or more features. Aspect ratios or the height-to-width ratio of the one or more features may be greater than or about 2:1, greater than or about 3:1, greater than or about 5:1, greater than or about 10:1, greater than or about 20:1, or greater. A second layer of material 415 may overly the first layer of material 410. The second layer of material 415 may also be a silicon-containing material, such as silicon oxide. A layer of silicon-and-nitrogen-containing material 420 may overly the second layer of material 415. The layer of silicon-and-nitrogen-containing material 420 may be silicon nitride. The second layer of material 415 and the layer of silicon-and-nitrogen-containing material 420 may extend into the one or more features defined by the first layer of material 410. It is to be understood that any number of additional materials may be formed in the structure 400 illustrated. It is to be understood that the noted structure is not intended to be limiting, and any of a variety of other semiconductor structures are similarly encompassed. Other exemplary structures may include two-dimensional and three-dimensional structures common in semiconductor manufacturing, and within which a silicon-and-nitrogen-containing material such as silicon nitride is to be removed relative to one or more other materials, as the present technology may selectively remove silicon-and-nitrogen-containing material materials relative to other exposed materials, such as silicon-containing mate-rials, and any of the other materials discussed elsewhere. Additionally, although a high-aspect-ratio structure may benefit from the present technology, the technology may be equally applicable to lower aspect ratios and any other structures.

Method 300 may include providing one or more precursors into a processing region of a semiconductor processing chamber housing the described substrate 405 at operation 305. The one or more precursors may include a hydrogen-containing precursor and/or an inert precursor. Plasma effluents of the one or more precursors may be formed at operation 310. In embodiments, the one or more precursors may be flowed through a remote plasma region of the processing chamber, such as region 215 described above, and a plasma may be formed of the one or more precursors to produce plasma effluents. Although a substrate-level plasma may be produced, in some embodiments the plasma may be a remote plasma, which may protect exposed substrate materials from ion bombardment that may occur due to the substrate-level plasma. Whether plasma-enhanced or not, at operation 315, the one or more precursors or plasma effluents thereof may contact the substrate 405 including the exposed layer of silicon-and-nitrogen-containing material 420. The contacting may etch a portion of the layer of silicon-and-nitrogen-containing material 420.

As previously discussed, the precursors used during method 300 and provided at operation 305 may include a hydrogen-containing precursor and/or an inert precursor. For example, non-limiting hydrogen-containing precursors may include diatomic hydrogen ($H_2$), water ($H_2O$), ammonia ($NH_3$), or any other hydrogen-containing material. Exemplary inert precursors may include one or more of argon, xenon, or helium in some embodiments, as well as any other non-reactive material. In embodiments, a flow rate of the inert precursor may be greater than a flow rate of the hydrogen-containing precursor. For example, a flow rate ratio of the inert precursor to the hydrogen-containing precursor may be greater than or about 2:1, and a flow rate ratio of the inert precursor to the hydrogen-containing precursor may be greater than or about 5:1, greater than or about 10:1, greater than or about 15:1, greater than or about 20:1, greater than or about 25:1, greater than or about 30:1, greater than or about 35:1, or higher. The increased flow rate of the inert precursor may dilute the hydrogen-containing precursor, which may control the etch rate of the layer of silicon-and-nitrogen-containing material 420. Additionally, the inert precursor may bombard the layer of silicon-and-nitrogen-containing material 420 which may soften the material for etching.

In embodiments, the one or more precursors may not include a halogen-containing precursor, and the processing region may be maintained halogen-free during method 300. While conventional technologies have utilized halogen materials for etching nitrogen-containing materials, such as silicon-and-nitrogen-containing material, the present technology may not require a halogen material. Instead, the present technology may remove nitrogen-containing materials, such as silicon-and-nitrogen-containing material, as a halogen-free method while maintaining high selectivity. Additionally, the present technology may therefore reduce and/or prevent buildup of halogen residue, whose presence may introduce issues with downstream processing.

The plasma effluents may be formed at a high plasma power to increase gas density and provide increase dissociation of the hydrogen-containing precursor to form more hydrogen-containing plasma effluents to react with the layer of silicon-and-nitrogen-containing material 420, and in some embodiments the plasma effluents may be formed at greater than or about 800 W, and may be formed at greater than or about 900 W, greater than or about 1,000 W, greater than or about 1,250 W, greater than or about 1,500 W, greater than or about 1,750 W, greater than or about 2,000 W, greater than or about 2,500 W, greater than or about 3,000 W, greater than or about 3,500 W, greater than or about 4,000 W, greater than or about 4,500 W, greater than or about 5,000 W, or more. At lower plasma powers, hydrogen dissociation may reduce and an etch rate of the layer of silicon-and-nitrogen-containing material 420 may reduce.

The plasma effluents of the hydrogen-containing precursor may be characterized by a high gas density while maintaining a low plasma potential. For example, the plasma potential of the plasma effluents of hydrogen-containing precursor may be less than or about 5.0 eV, and may be less than or about 4.9 eV, less than or about 4.8 eV, less than or about 4.7 eV, less than or about 4.6 eV, less than or about 4.5 eV, less than or about 4.4 eV, less than or about 4.3 eV, less than or about 4.2 eV, less than or about 4.1 eV, less than or about 4.0 eV, less than or about 3.9 eV, less than or about 3.8 eV, less than or about 3.7 eV, less than or about 3.6 eV, less than or about 3.5 eV, or less.

Figure 4B:
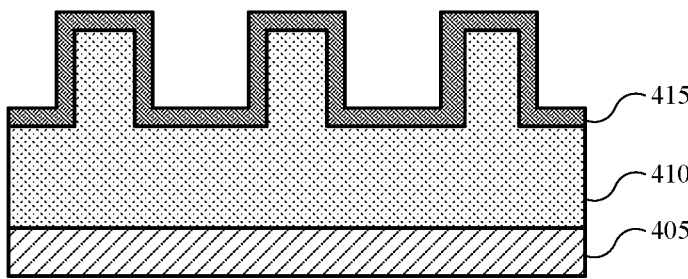

As illustrated in FIG. 4B, the contacting may etch the layer of silicon-and-nitrogen-containing material 420. While illustrated as removing the entire layer of silicon-and-nitrogen-containing material 420, the method 300 may also be controlled to remove a portion of the layer of silicon-and-nitrogen-containing material 420. By contacting the layer of silicon-and-nitrogen-containing material 420 with the inert precursor and/or the hydrogen-containing precursor, or plasma effluents thereof, Si—N bonds in the layer of silicon-and-nitrogen-containing material 420 may be broken. The contacting and the resultant breakage of Si—N bonds may form volatile byproducts, such as silane ($SiH_4$) and/or ammonia ($NH_3$). During the contacting, at least a portion of the layer of silicon-and-nitrogen-containing material 420 may be selectively etched to other materials on the substrate 405, such as second layer of material 415, which may be silicon oxide, due to the difference in bond energy. Si—N bonds in the layer of silicon-and-nitrogen-containing material 420 may be characterized by a bond energy of about 3.5 eV, whereas Si—O bonds in the second layer of material 415 may be characterized by a bond energy of about 4.5 eV. Accordingly, by maintaining the plasma potential of the hydrogen-containing precursor at the values previously discussed, the Si—N bonds in the layer of silicon-and-nitrogen-containing material 420 may be selectively broken over the Si—O bonds in the second layer of material 415.

Processing conditions may impact and facilitate etching according to the present technology. For example, the temperature at which the operations are performed may impact the extent to which the reaction may occur. During the contacting of the layer of silicon-and-nitrogen-containing material with the hydrogen-containing precursor or plasma effluents thereof, reduced temperatures may facilitate the reaction and high selectivity. Accordingly, in some embodiments of the present technology, the method 300 may be performed at substrate, pedestal, and/or chamber temperatures less than or about 50° C., and may be performed at temperatures less than or about 25° C., less than or about 0° C., less than or about −25° C., less than or about −50° C., less than or about −75° C., less than or about −100° C., or less. The temperature may also be maintained at any temperature within these ranges, within smaller ranges encompassed by these ranges, or between any of these ranges.

The pressure within the processing region of the semiconductor processing chamber may also affect the operations performed. To facilitate the etching and removal of byproducts, a processing pressure may be less than or about 100 mTorr, and may be maintained at less than or about 80 m Torr, less than or about 60 mTorr, less than or about 40 mTorr, less than or about 20 mTorr, less than or about 15 mTorr, less than or about 10 mTorr, less than or about 8 mTorr, less than or about 6 mTorr, less than or about 4 mTorr, less than or about 3 mTorr, or less. The pressure may also be maintained at any pressure within these ranges, within smaller ranges encompassed by these ranges, or between any of these ranges.

By performing the processes as described above, the etch rate of silicon nitride may be greater than or about 1.0 Å/min, greater than or about 1.5 Å/min, greater than or about 2.0 Å/min, greater than or about 2.5 Å/min, greater than or about 3.0 Å/min, greater than or about 3.5 Å/min, greater than or about 4.0 Å/min, greater than or about 4.5 Å/min, greater than or about 5.0 Å/min, greater than or about 5.5 Å/min, or more. Similarly, a selective etch of silicon-and-nitrogen-containing material relative to other materials present, such as silicon material or silicon-and-oxygen-containing material, may be maintained at greater than or about 5:1, and may maintain a selective etch of greater than or about 10:1, greater than or about 15:1, greater than or about 20:1, greater than or about 25:1, greater than or about 30:1, greater than or about 35:1, greater than or about 40:1, greater than or about 50:1, greater than or about 75:1, greater than or about 100:1, or higher. In embodiments, other materials present, such as silicon material or silicon-and-oxygen-containing material, may not be etched during removal of silicon-and-nitrogen-containing material.

In the preceding description, for the purposes of explanation, numerous details have been set forth in order to provide an understanding of various embodiments of the present technology. It will be apparent to one skilled in the art, however, that certain embodiments may be practiced without some of these details, or with additional details.

Having disclosed several embodiments, it will be recognized by those of skill in the art that various modifications, alternative constructions, and equivalents may be used without departing from the spirit of the embodiments. Additionally, a number of well-known processes and elements have not been described in order to avoid unnecessarily obscuring the present technology. Accordingly, the above description should not be taken as limiting the scope of the technology.

Where a range of values is provided, it is understood that each intervening value, to the smallest fraction of the unit of the lower limit, unless the context clearly dictates otherwise, between the upper and lower limits of that range is also specifically disclosed. Any narrower range between any stated values or unstated intervening values in a stated range and any other stated or intervening value in that stated range is encompassed. The upper and lower limits of those smaller ranges may independently be included or excluded in the range, and each range where either, neither, or both limits are included in the smaller ranges is also encompassed within the technology, subject to any specifically excluded limit in the stated range. Where the stated range includes one or both of the limits, ranges excluding either or both of those included limits are also included.

As used herein and in the appended claims, the singular forms "a", "an", and "the" include plural references unless the context clearly dictates otherwise. Thus, for example, reference to "a precursor" includes a plurality of such precursors, and reference to "the layer" includes reference to one or more layers and equivalents thereof known to those skilled in the art, and so forth.

Also, the words "comprise(s)", "comprising", "contain(s)", "containing", "include(s)", and "including", when used in this specification and in the following claims, are intended to specify the presence of stated features, integers, components, or operations, but they do not preclude the presence or addition of one or more other features, integers, components, operations, acts, or groups.

The invention claimed is:

1. A semiconductor processing method comprising:
providing a hydrogen-containing precursor to a processing region of a semiconductor processing chamber, wherein a substrate is disposed on a substrate support within the processing region, and wherein a layer of silicon-and-nitrogen-containing material is disposed on the substrate;
forming plasma effluents of the hydrogen-containing precursor; and
contacting the layer of silicon-and-nitrogen-containing material with plasma effluents of the hydrogen-containing precursor, wherein the contacting etches a portion of the layer of silicon-and-nitrogen-containing material, wherein the processing region is maintained halogen-free.

2. The semiconductor processing method of claim 1, wherein the hydrogen-containing precursor comprises diatomic hydrogen ($H_2$).

3. The semiconductor processing method of claim 1, wherein a layer of silicon-and-oxygen-containing material, a layer of silicon-containing material, or both are disposed on the substrate.

4. The semiconductor processing method of claim 1, further comprising:
providing an inert precursor with the hydrogen-containing precursor to the processing region.

5. The semiconductor processing method of claim 4, wherein a flow rate of the inert precursor is greater than a flow rate of the hydrogen-containing precursor.

6. The semiconductor processing method of claim 1, wherein the plasma effluents are formed at a plasma power of greater than or about 800 W.

7. The semiconductor processing method of claim 1, wherein the plasma effluents are formed at a plasma power of greater than or about 2,000 W.

8. The semiconductor processing method of claim 1, wherein the contacting forms silane ($SiH_4$), ammonia ($NH_3$), or both.

9. The semiconductor processing method of claim 1, wherein the substrate is characterized by a temperature of less than or about 50° C.

10. The semiconductor processing method of claim 1, wherein the substrate is characterized by a temperature of less than or about –25° C.

11. The semiconductor processing method of claim 1, wherein a pressure within the semiconductor processing chamber is maintained at less than or about 100 mTorr.

12. The semiconductor processing method of claim 1, wherein the contacting etches the layer of silicon-and-nitrogen-containing material at an etch rate of greater than or about 1 Å/min.

13. A semiconductor processing method comprising:
providing a hydrogen-containing precursor to a processing region of a semiconductor processing chamber, wherein a substrate is disposed on a substrate support within the processing region, wherein a layer of silicon-and-oxygen-containing material is disposed on the substrate, and wherein a layer of silicon-and-nitrogen-containing material is disposed on the layer of silicon-and-oxygen-containing material;
forming plasma effluents of the hydrogen-containing precursor, wherein the plasma effluents are formed at a plasma power of greater than or about 1,000 W; and contacting the layer of silicon-and-nitrogen-containing material with plasma effluents of the hydrogen-containing precursor, wherein the contacting selectively etches a portion of the layer of silicon-and-nitrogen-containing material relative to the layer of silicon-and-oxygen-containing material.

14. The semiconductor processing method of claim 13, wherein the processing region is maintained halogen-free.

15. The semiconductor processing method of claim 13, wherein the substrate is characterized by a temperature of less than or about 50° C.

16. A semiconductor processing method comprising:

providing a hydrogen-containing precursor to a processing region of a semiconductor processing chamber, wherein a substrate is disposed on a substrate support within the processing region, wherein a layer of silicon-and-oxygen-containing material is disposed on the substrate, and wherein a layer of silicon-and-nitrogen-containing material is disposed on the layer of silicon-and-oxygen-containing material;

forming plasma effluents of the hydrogen-containing precursor; and contacting the layer of silicon-and-nitrogen-containing material with plasma effluents of the hydrogen-containing precursor, wherein the contacting selectively etches a portion of the layer of silicon-and-nitrogen-containing material relative to the layer of silicon-and-oxygen-containing material, and wherein the substrate is characterized by a temperature of less than or about –50° C.

17. The semiconductor processing method of claim 16, further comprising:

providing helium with the hydrogen-containing precursor to the processing region.

18. The semiconductor processing method of claim 16, wherein the processing region is maintained halogen-free.

19. The semiconductor processing method of claim 16, wherein the plasma effluents are formed at a plasma power of greater than or about 1,000 W.

20. The semiconductor processing method of claim 16, wherein the contacting selectively etches the portion of the layer of silicon-and-nitrogen-containing material relative to the layer of silicon-and-oxygen-containing material at a selectivity of greater than or about 5:1.

* * * * *